United States Patent
Usui et al.

(10) Patent No.: US 10,165,690 B2
(45) Date of Patent: Dec. 25, 2018

(54) SOLDER JOINT STRUCTURE OF FLEXIBLE PRINTED CIRCUIT BOARD

(71) Applicant: Nippon Telegraph and Telephone Corporation, Tokyo (JP)

(72) Inventors: Mitsuo Usui, Atsugi (JP); Kiyofumi Kikuchi, Atsugi (JP); Ken Tsuzuki, Atsugi (JP); Hiroshi Fukuda, Atsugi (JP); Shuichiro Asakawa, Atsugi (JP); Shin Kamei, Atsugi (JP); Shunichi Soma, Atsugi (JP); Takashi Saida, Atsugi (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 15/735,726

(22) PCT Filed: Jun. 17, 2016

(86) PCT No.: PCT/JP2016/002932
§ 371 (c)(1),
(2) Date: Dec. 12, 2017

(87) PCT Pub. No.: WO2016/203774
PCT Pub. Date: Dec. 22, 2016

(65) Prior Publication Data
US 2018/0199445 A1    Jul. 12, 2018

(30) Foreign Application Priority Data
Jun. 19, 2015  (JP) .................................. 2015-124271

(51) Int. Cl.
*H05K 1/11*      (2006.01)
*H05K 3/36*      (2006.01)
(Continued)

(52) U.S. Cl.
CPC ............... *H05K 3/363* (2013.01); *H05K 1/11* (2013.01); *H05K 1/111* (2013.01); *H05K 1/14* (2013.01);
(Continued)

(58) Field of Classification Search
CPC . H05K 1/11; H05K 1/14; H05K 1/111; H05K 1/189; H05K 3/34; H05K 3/36;
(Continued)

(56) References Cited

U.S. PATENT DOCUMENTS 5,822,030 A * 10/1998 Uchiyama ........... G02F 1/13452
                                             349/149
6,144,090 A * 11/2000 Higashiguchi .......... H01L 23/24
                                             257/690
(Continued)

FOREIGN PATENT DOCUMENTS

JP    S62-46589 A     2/1987
JP    S63-283182 A    11/1988
(Continued)

OTHER PUBLICATIONS

International Preliminary Report on Patentability dated Dec. 19, 2017, issued in PCT Application No. PCT/JP2016/002932, filed Jun. 17, 2016.

*Primary Examiner* — Xiaoliang Chen
(74) *Attorney, Agent, or Firm* — Workman Nydegger

(57) ABSTRACT

In a conventional soldering method, an FPC-side electrode pad and a package-side electrode pad are closely joined together with a solder layer, and the soldered state after a joining process has not been easily confirmed visually. The present invention provides a solder joint structure including a side face electrode which is formed on each of the side faces of the end parts of an FPC board and a package or PCB board that are to be soldered, extending vertically relative to (Continued)

the faces constituting each of electrode pads on the boards, and which introduces solder. On the side face electrodes of the board end parts, a part of solder that is formed continuously from the solder joint portion is visible and the state of the solder joint between the electrode pads on the two boards can be confirmed. The efficiency of solder joint tests can be improved.

5 Claims, 21 Drawing Sheets

(51) Int. Cl.
    *H05K 1/14*            (2006.01)
    *H05K 1/18*            (2006.01)
    *H05K 3/34*            (2006.01)

(52) U.S. Cl.
    CPC ........... *H05K 1/189* (2013.01); *H05K 3/3463* (2013.01); *H05K 3/36* (2013.01)

(58) Field of Classification Search
    CPC ....... H05K 3/3463; H01L 23/16; H01L 23/28; H01L 23/31; H01L 23/48
    USPC ........ 174/263, 260, 261, 264; 257/434, 693, 257/698, 724
    See application file for complete search history.

(56) References Cited

U.S. PATENT DOCUMENTS

| | | | | |
|---|---|---|---|---|
| 6,147,876 | A * | 11/2000 | Yamaguchi | H01L 23/24 257/698 |
| 6,534,726 | B1 * | 3/2003 | Okada | H01L 23/49805 174/260 |
| 2001/0007371 | A1 * | 7/2001 | Kawaguchi | H01L 23/3121 257/698 |
| 2002/0029905 | A1 * | 3/2002 | Okada | H01L 21/4853 174/263 |
| 2008/0001240 | A1 * | 1/2008 | Minamio | H01L 27/14618 257/434 |
| 2008/0057743 | A1 | 3/2008 | Sogabe | |
| 2011/0220406 | A1 * | 9/2011 | Doi | H05K 3/4038 174/264 |

FOREIGN PATENT DOCUMENTS

| | | |
|---|---|---|
| JP | H09-219572 A | 8/1997 |
| JP | H11-103145 A | 4/1999 |
| JP | 3569578 A | 6/2004 |
| JP | 2008-60329 A | 3/2008 |
| JP | 2013-16654 A | 1/2013 |
| JP | 2015-38915 A | 2/2015 |

* cited by examiner

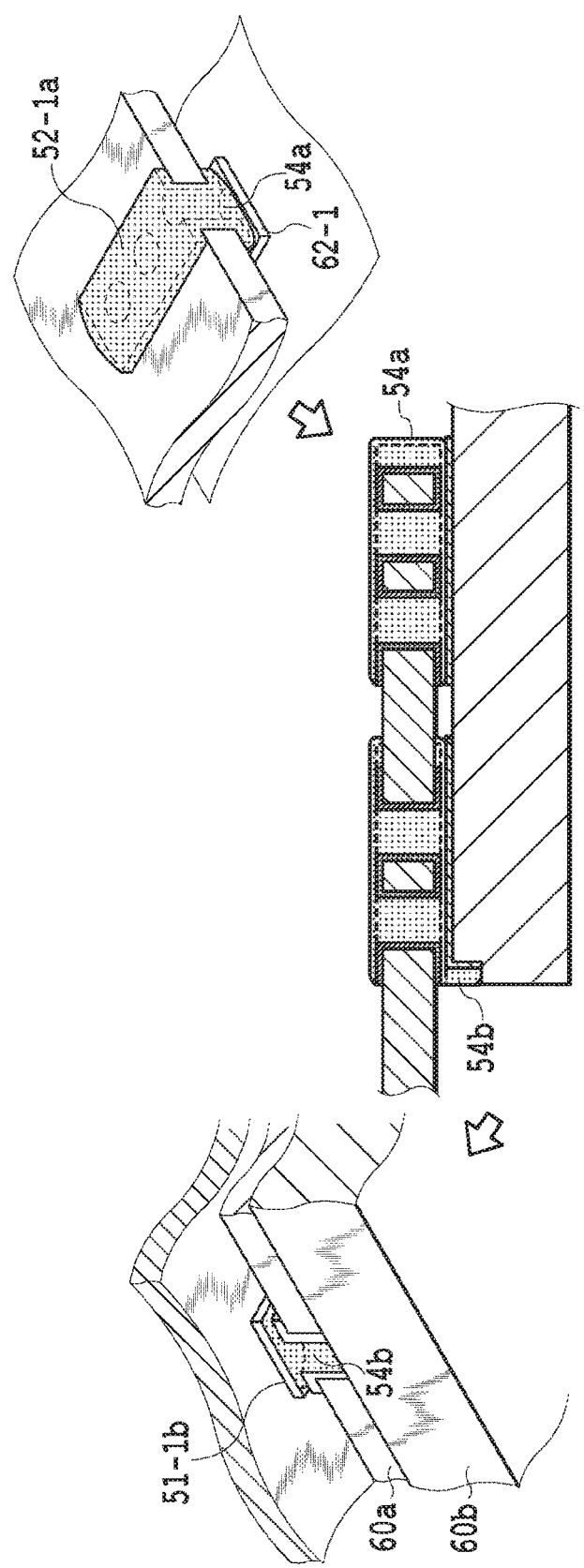

SOLDER JOINT STRUCTURE OF FLEXIBLE PRINTED CIRCUIT BOARD

TECHNICAL FIELD

The present invention relates to a solder joint structure, and more particularly, relates to a structure of joining a flexible printed circuit board to a printed circuit board or a package or the like on which an electric component or optical component is mounted by using solder.

BACKGROUND ART

Recently, under the circumstances of explosive diffusion of smartphones, portable tablet terminals, and the like, and the start of video distribution services, the increase in the volume of optical network transmission is in demand. As major components in optical communications to satisfy such needs, optical transceiver modules including fundamental functions such as electricity-light conversion, light-electricity conversion, amplification, reproduction demodulation are widely used. As the optical transceiver module, communication systems such as a wavelength division multiplexing system which transmits a divided signal to a plurality of channels via a plurality of different carrier waves and a parallel transmission system which transmits a plurality of channels as they are via a plurality of optical fibers (multi-core optical fiber tape) are used. In order to achieve these communication systems, a multi-channel optical transceiver module capable of inputting/outputting multi-channel electric signals in a single casing is essential, and its research and development have also been actively made recently.

The optical transceiver module includes a package composed of a casing accommodating a photoelectric transducer and the like therein, an electrical wiring connection unit constituting a part of the package, and an optical fiber connection unit. The package composed of the casing of the optical transceiver module is formed by ceramic, for example. The term "package" is often used to generally indicate a container to mount thereon and accommodate therein an electric element, an optical element, an integrated circuit (IC), and the like. However, in the below-described explanations associated with the present invention, a package having a broader form beyond a container which also includes the electrical wiring connection unit is to be used. For example, the package includes various forms such as a box-type package which is entirely hermetic sealed, a package not being hermetic sealed, a package having an open part on the top or the like so that an electric element can be seen, and a simple plate-like package having no side walls and only having an electric element or the like mounted thereon. Here, the package includes electrical wirings formed therein which are connected to an electric element or the like on the package, and an electrode pad, located in the vicinity of the end part of the package, which can connect to an external circuit as the electrical wiring connection unit.

The optical transceiver module has a function of converting an electric signal inputted from the external circuit via an electrical wiring into an optical signal to output it to an optical fiber, and in contrast, converting an optical signal inputted from the optical fiber into an electric signal to output it to the external circuit via the electrical wiring. To be more specific, a board constituting at least a part of an optical semiconductor device (such as a semiconductor laser, light receiving element, and modulation element) and a package on which the optical semiconductor device is mounted and an external circuit board in which a signal generation circuit (such as a drive circuit and an amplification circuit) is mounted are electrically connected by using a flexible printed circuits board (FPC) to realize a high-speed signal transmission.

For handling multi-channel signals in the optical transceiver module, electric terminals to input/output a plurality of electric signals by connecting them to the external circuit are required for an amount according to the number of multiplexes and the number of parallels for a system. Further, besides the terminals of electric signals, a number of electric terminals such as a terminal for power supply and a terminal for controlling an IC mounted inside the package and for monitoring the state of such control are required.

In the optical transceiver module which handles multi-channel signals and which is simultaneously required to be minimized, a flexible printed circuit board (hereinafter referred to as an FPC) which has higher density compared to connection using pins is used as electrical wirings as disclosed in PTL 1. The FPC is widely used in electric equipment and portable phones besides its implementation to the optical transceiver module. For example, in general LSI implementation, the FPC is used for bundling electrical wirings to other LSI circuits having multiple terminals and electric connections to a printed circuit board (PCB) and the like.

The FPC is used for electrical wirings between the PCB forming the external circuit and a ceramic-made package or any other board often used as an optical transceiver module casing. An electrode pad formed at the end part of the FPC is joined to an electrode pad on the PCB, the package, or the like by using highly reliable solder.

FIG. 9A and FIG. 9B are views illustrating a method of soldering an FPC using a conventional technique. FIG. 9A is a first view of the soldering method, which shows, in the end part of an FPC 200 before soldering and in an electrical wiring connection unit 100 in a package of an optical transceiver module, a cross section that vertically cuts each of the electrode pads with respect to each of the board faces. In the optical transceiver module, multiple electrode pads are formed at a part protruded, in a terrace shape, from one side face of a generally rectangular casing for soldering them to the electrode pads on the FPC. FIG. 9A depicts an electrical wiring connection unit in a terrace-like protruded portion 100 constituting a part of the package. It should be noted that a target to be joined to the FPC is not limited to the terrace-like protruded portion, but may also be an electrical wiring connection unit at its end part of the PCB as long as the optical transceiver module is constituted by a simple flat plate-like PCB. For simplifying descriptions including the case of the PCB, the side of the optical transceiver module is hereinafter referred to as a package 100. FIG. 9B is a second view of the soldering method, which indicates a state during a soldering process.

With reference to FIG. 9A, an electrode pad 101 is formed on the joining face side of the package 100. The FPC has any shape depending on a position of implementing a package, board, or the like to be connected and is composed of a thin and flexible material compared to normal printed circuit boards by forming, for example, a conductive foil on a basis of a film-like insulator. Multiple corresponding electrode pads to be soldered to the electrode pads 101 on the package 100 side are formed on at least one end of the FPC 200. As shown in FIG. 9A, each of the electrode pads at the end part of an FPC board 203 is formed on a position corresponding to conductive electrodes 202a, 202b sandwiching the board 203 therebetween which are connected via a via 201 filled with metal or the like. On the conductive electrode 202b on the side to be joined to the package 100, a solder layer 204 is formed in advance. As shown in FIG. 9B, when soldering the FPC 200 to the package 100 via the electrode pads, a method of soldering using a thermocompression tool 300, as disclosed in PTL 2, is used. When simultaneous heating and pressurizing are made, by the thermocompression tool 300, on the conductive electrode 202a which is a side opposite the joining face side of the FPC 200, heat is transferred to the joining face side via the via 201 to melt the solder layer 204, and thus the conductive electrode 202b and the electrode pad 101 are joined by soldering.

CITATION LIST

Patent Literature

PTL 1: Japanese Patent Laid-Open No. 2015-38915
PTL 2: Japanese Patent No. 3569578

SUMMARY OF INVENTION

However, in the soldering method shown in FIG. 9A and FIG. 9B, the solder layer having the thickness of approximately 10 to 20 μm closely joins the electrode pads on the FPC side and the electrode pad on the package side together, and accordingly, a joined state during the soldering process cannot be easily confirmed visually. Since a conduction inspection between wirings by, for example, measuring resistance values needs to be made for an electric path including a joint portion, quite a long time has been required for the inspection. In a normal electrode pad connecting an electric element or the like on a board face, the shape of solder can be easily confirmed by visual inspection or by shape recognition, and a testing process can be efficiently performed by discovering and removing a defective solder joint portion beforehand. However, in a case where soldering is made between the FPC and the package in the process as shown in FIG. 9A and FIG. 9B and in a circumstance where an electrode pad for the optical transceiver module is significantly small, conduction tests for all the electrode pads have been required to discover a defective joint, which has resulted in suppressing the efficiency of the manufacturing processes.

An object of the present invention is to provide, in consideration of the above problems, a solder joint structure which allows easy visual confirmation of a joined state at the time of soldering and which allows achieving efficiency of inspections. It should be noted that the term "solder joint" is focused on a structure constituted by soldering, and that solder connection can be used in the same meaning.

In order to respond to the above problem, according to one aspect of the present invention, a solder joint structure connects a first board composed of a first material having flexibility and a second board composed of a second material that is different from the first material, wherein the first board includes a plurality of electrode pads formed along an end part of the first board, each of the plurality of electrode pads includes two corresponding conductive electrodes having generally the same shape on both faces sandwiching the first board, the two corresponding conductive electrodes are mutually connected by at least one through hole, and the two corresponding conductive electrodes, including an inner part of the through hole, have a solder layer formed thereon; the second board includes a plurality of electrode pads formed along an end part of the second board to face the conductive electrodes on one face of the first board, and a side face electrode formed continuously from the plurality of facing electrode pads onto a side face of the end part of the second board; and the conductive electrodes on the one face of the first board and the plurality of facing electrode pads on the second board are solder joined with the solder layer, and a joined state of a soldered portion on the side face electrode formed continuously from the solder joint is configured to be visible from the first board side of the solder joint.

According to another aspect of the present invention, a solder joint structure connects a first board composed of a first material having flexibility and a second board composed of a second material that is different from the first material, wherein the first board includes a plurality of electrode pads formed along an end part of the first board, each of the plurality of electrode pads includes two corresponding conductive electrodes having generally the same shape on both faces sandwiching the first board, the two corresponding conductive electrodes are mutually connected by at least one through hole, the two corresponding conductive electrodes, including an inner part of the through hole, have a solder layer formed thereon, and the two corresponding conductive electrodes are further mutually connected by a side face electrode formed on a side face of the end part of the first board; the second board includes a plurality of electrode pads formed along an end part of the second board to face the conductive electrodes on one face of the first board; and the conductive electrodes on the one face of the first board and the plurality of facing electrode pads on the second board are solder joined with the solder layer, and a joined state of a soldered portion on the side face electrode formed continuously from the solder joint is configured to be visible from the second board side of the solder joint.

In the above-described aspect, it is preferable that the second board include a side face electrode formed continuously from the plurality of facing electrode pads onto the second board on a side face of the end part of the second board, and that a joined state of a soldered portion on the side face electrode formed continuously from the solder joint be configured to be visible from the first board side of the solder joint.

Further, the side face electrode of the first board may be formed by cutting a through hole, which pierces the first board, in a vertical direction with respect to a face of the first board. The side face electrode of the second board may be formed by cutting a through hole, which pierces at least a part of the second board in a thickness direction, in a vertical direction with respect to a face of the second board.

The plurality of electrode pads of the first board and the plurality of facing electrode pads of the second board may each be formed in two or more rows along the board end part, and each of the side face electrodes may be formed on an electrode pad on a closest row to the end part of the respective boards.

In the above-described aspect, it is preferable that the first board be a flexible printed circuit board (FPC) in which the plurality of electrode pads are formed on one end, and that the second board be a ceramic package or a printed circuit board (PCB) in which the plurality of facing electrode pads are formed on the end part.

Further, the solder joint may be formed by aligning the plurality of electrode pads of the first board with the plurality of facing electrode pads of the second board and by heating and pressurizing the plurality of electrode pads of the first board and the plurality of facing electrode pads of the second board so as to melt the solder layer.

Also, as a still another aspect of the present invention, an optical transceiver module may be configured to comprise the solder joint structure of each of the above-described aspects on a terrace-like board protruded from a package which is a casing.

As described above, according to the solder joint structure of the present invention, in the case of soldering the FPC to a package, a PCB, or the like using electrode pads, the state of a solder joint can be easily confirmed visually. The passed/failed state of the solder joint can be judged even without conducting a conduction inspection, and therefore, an efficient inspecting process can be achieved.

BRIEF DESCRIPTION OF DRAWINGS

FIG. 8C is a third view illustrating the joining process of the solder joint structure according to the second embodiment of the present invention;

DESCRIPTION OF EMBODIMENTS

A solder joint structure of the present invention includes a side face electrode which is formed on each of the side faces of the end parts of an FPC board and a package or PCB board that are to be soldered, extending vertically relative to the faces constituting each of electrode pads on the boards, and which introduces solder. On the side face electrodes of the board end parts, a part of solder that is formed continuously from the solder joint portion is visible and the state of the solder joint between the electrode pads on two boards to be soldered can be confirmed. The efficiency of solder joint tests can be improved by providing an electrode pad configuration which allows to form solder joint portions that are sufficiently visible from the side faces of the board end parts. The present invention can be carried out as an optical transceiver module including the above-described solder joint structure. Furthermore, the present invention can be carried out as an invention of a soldering method.

The solder joint structure of the present invention relates to soldering between a plurality of electrode pads formed on the end part of a first board composed of a first board material having a flexible structure and a plurality of electrode pads formed on the end part of a second board composed of a second board material having a more rigid structure which differs from the first board material. The first board is, for example, a flexible printed circuit board (FPC), the second board may be a part of the package as a container for the optical transceiver module formed by ceramic or the like, or may be a plate-like printed circuit board (PCB) to serve the function of the optical transceiver module. The term "package" refers to a container which mounts and builds an element to serve functions such as the optical transceiver module. However, the shapes of the package may vary, which include a plate-like simple board and a terrace-like portion part of which is protruded from the side face or the like of the casing. In addition, an electrical wiring connection unit is included in the package.

Further, a function to be served by the element or the like mounted or built in the package is not limited to the above-described optical transceiver module, and may also include a module or a board (PCB) which serves various other functions by processing electric signals or optical signals. The present invention may be widely applied to the cases of forming solder joints between a plurality of electrode pads formed along the end part of the FPC and their corresponding electrode pads formed on the end part of a package or a board which is different from the FPC. A specific configuration of the solder joint structure of the present invention will be described below with reference to the drawings.

First Embodiment

Figure 1A:
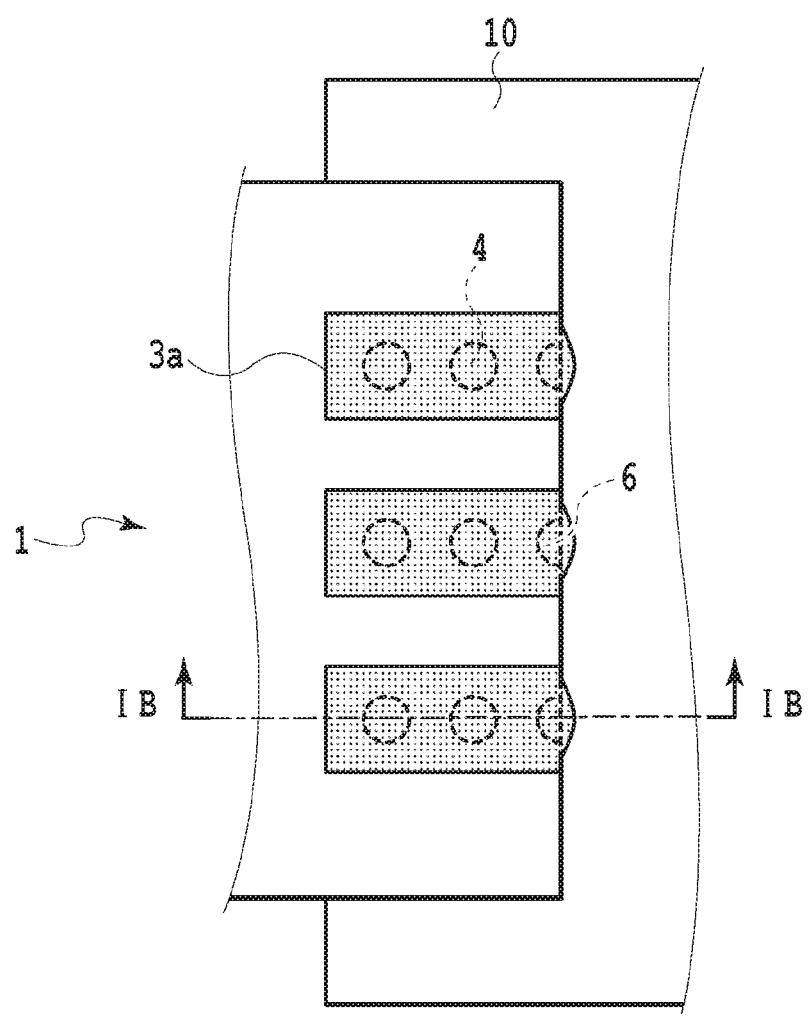
FIG. 1A is a top view showing a configuration according to a first embodiment of a solder joint structure of the present invention.
Figure 1B:
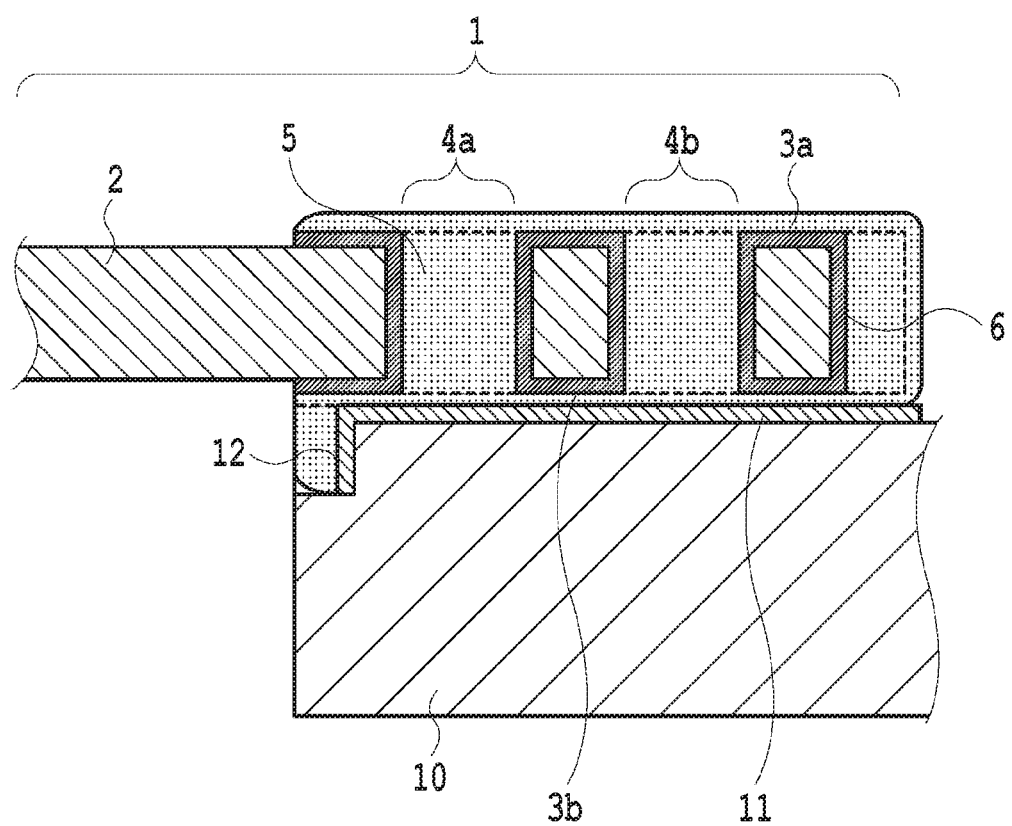
FIG. 1B is a cross-section view showing the configuration according to the first embodiment of the solder joint structure of the present invention.

FIG. 1A and FIG. 1B are views showing a configuration according to a first embodiment of a solder joint structure of the present invention. FIG. 1A is a top view viewing a board face in a state in which an FPC 1 composed of a board material such as polyimide and a package 10 composed of a board material such as ceramic are joined by soldering. FIG. 1B is a view viewing a cross section which is vertical to each of board faces of the FPC 1 and package 10 through the IB-IB line of FIG. 1A. The FPC 1 has a plurality of electrode pads formed at its end part. The electrode pads include conductive electrodes, and are electrically connected to other circuits via solder joints and bonding wires. Each of the electrode pads formed along the end part of the FPC 1 board includes a plurality of conductive electrodes 3b on aboard face (joining face) on a side to be soldered and their corresponding conductive electrodes 3a on a board face opposite the joining face sandwiching a board 2 of the FPC 1 therebetween. In other words, the conductive electrodes 3a and the conductive electrodes 3b face each other with the board 2 located therebetween. The two corresponding conductive electrodes 3a, 3b have generally the same shape, and through holes 4a, 4b electrically connecting each of the conductive electrodes 3a, 3b connect both of the faces. The through holes 4a, 4b are filled with solder 5. The solder joint structure of the present invention includes a side face connecting electrode 6 (first side face electrode) on a board end face formed continuously from the conductive electrodes 3a, 3b on the plurality of electrode pads of the FPC 1.

On the board face of the end part of the package 10 board, electrode pads 11 which are to be soldered to the plurality of electrode pads of the FPC 1 are formed. Further, on the side face of the end part of the package 10 board, a side face interconnection electrode 12 (second side face electrode) formed continuously from the electrode pad 11 is formed. Solder extends over the side face connecting electrode 6 of the FPC 1 and the side face interconnection electrode 12 of the package 10 by soldering. Next, a configuration of each of the electrode pads on the FPC 1 and the package 10 will be explained in more detail.

Figure 2A:
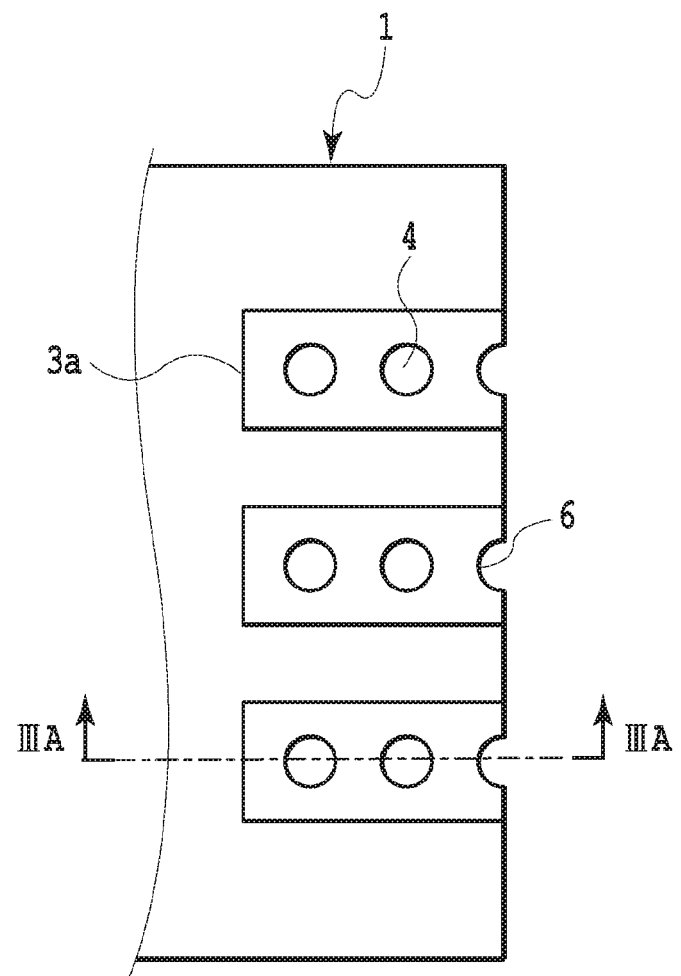
FIG. 2A is a top view illustrating a specific configuration on an FPC side in the solder joint structure of the present invention.
Figure 2B:
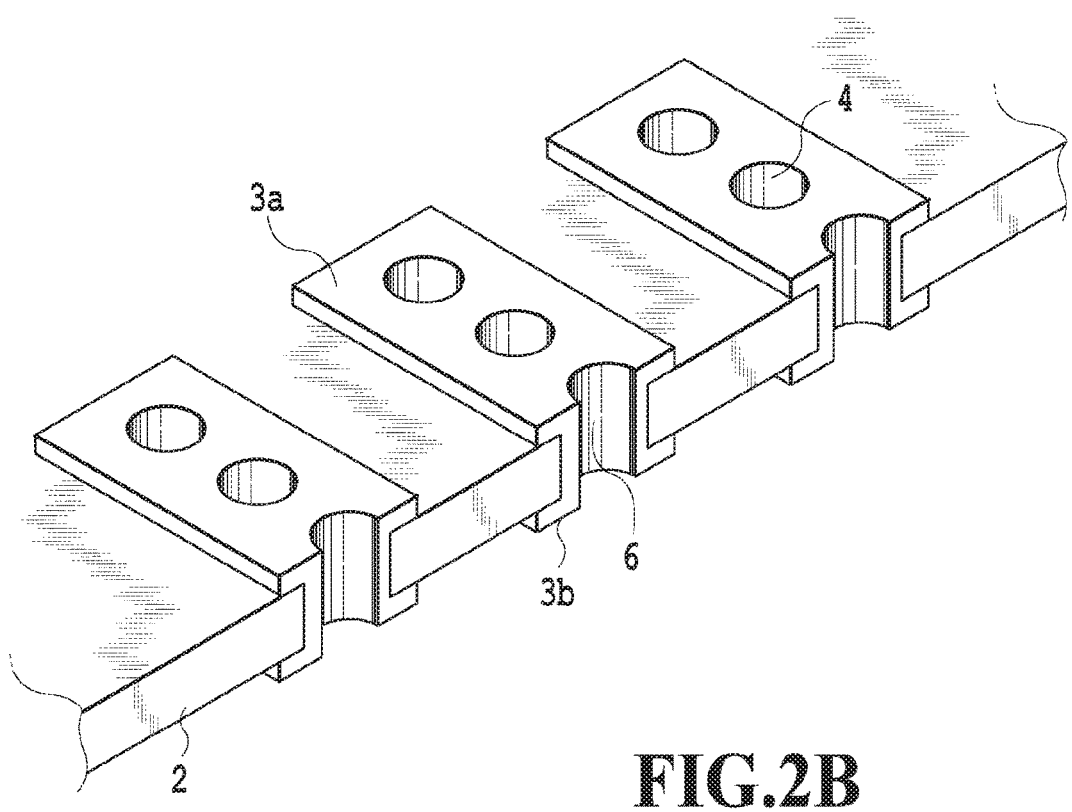
FIG. 2B is a perspective view illustrating a specific configuration on the FPC side in the solder joint structure of the present invention.

FIG. 2A and FIG. 2B are views illustrating a specific configuration on the FPC side in the solder joint structure of the present invention. FIG. 2A is a top view viewing a board face in the state where preliminary soldering which will be described later is not yet formed. FIG. 2B is a perspective view viewing a side face of the board end which includes the plurality of electrode pads on the FPC. The FPC 1 is composed of a flexible material such as polyimide as a base material and forms wirings using copper (Cu) for a surface or an inner layer of the base material. On at least its one end, the conductive electrodes 3a, 3b of the above-described plurality of electrode pads to be soldered to the package are formed. With reference to FIG. 2B, on the board end face, the side face connecting wiring 6 electrically connecting the conductive electrode 3a on the upper side and the conductive electrode 3b on the lower side of the board 2 in the drawing is formed. Their corresponding electrodes on both faces of the board are each connected via the side face connecting wiring 6.

Figure 3A:
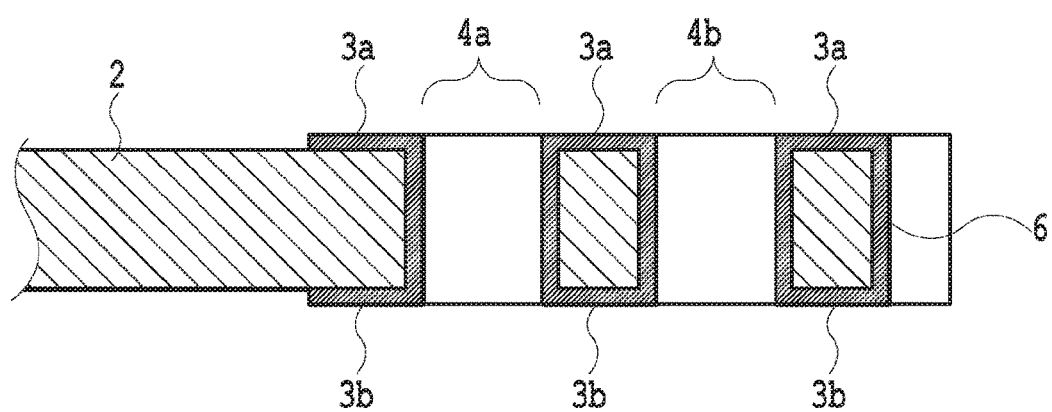
FIG. 3A is a first view further illustrating an electrode sectional structure on the FPC side in the solder joint structure of the present invention.
Figure 3B:
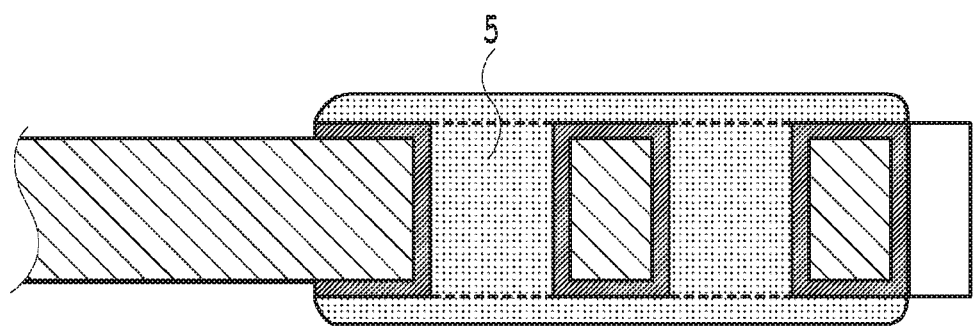
FIG. 3B is a second view further illustrating the electrode sectional structure on the FPC side in the solder joint structure of the present invention.

FIG. 3A and FIG. 3B are views further illustrating a sectional structure of the electrodes on the FPC side in the solder joint structure of the present invention. FIG. 3A is a view viewing a cross section vertical to the board face including the IIIA-IIIA line in FIG. 2A, and FIG. 3B is a cross-section view in a preliminarily soldered state. The side face connecting wiring 6 (first side face electrode) of the end part of the FPC in the solder joint structure of the present invention can be produced by cutting one through hole formed on the FPC in a direction vertical to the board. Typically, one FPC is produced by cutting a large master board in which multiple FPCs forming electrodes and inner wirings are arranged into individual pieces to form a final EPC shape. By cutting the through hole into half, the shape of the side face connecting wiring 6 shown in FIG. 3A can be formed.

In the soldering of the present invention, the FPC uses board materials such as, for example, polyimide and liquid crystal polymer (LCP), and the thickness of the board is approximately 35 to 50 μm. The electrode pad has 20 to 40 terminals arranged along the end part of the board, and its entire length in an array direction is approximately 5 to 20 mm. One of the electrode pads is 350 μm in width and 800 μm in length, and its arranging pitch is 700 wn. The thickness of the conductive electrode is 15 to 40 μm. Each of the above dimensions is only an example, and the present invention is not at all limited to these values.

In order to form the solder joint structure of the present invention, solder is required to fill over the conductive electrodes 3a, 3b on the electrode pads of the FPC 1 and the inside of the through holes 4a, 4b. As shown in FIG. 3B, on one side or both sides of the conductive electrodes 3a, 3b on the top and lower faces, the paste of the solder 5 is formed in the same size as a pad size by printing. After printing, reflow is made amid atmosphere, nitrogen (N2), vacuum, formic acid (HCOOH) atmosphere, or the like, and as shown in FIG. 3B, the through holes 4a, 4b are also filled with solder. In the state where solder is filled in FIG. 3B, the solder layer has a structure swelled in a convex shape by the maximum height of approximately 100 to 150 μm from the conductive electrode due to a surface tension. Although not shown in the drawing, solder is soaked to spread over the tip end of the electrode portion.

Figure 4A:
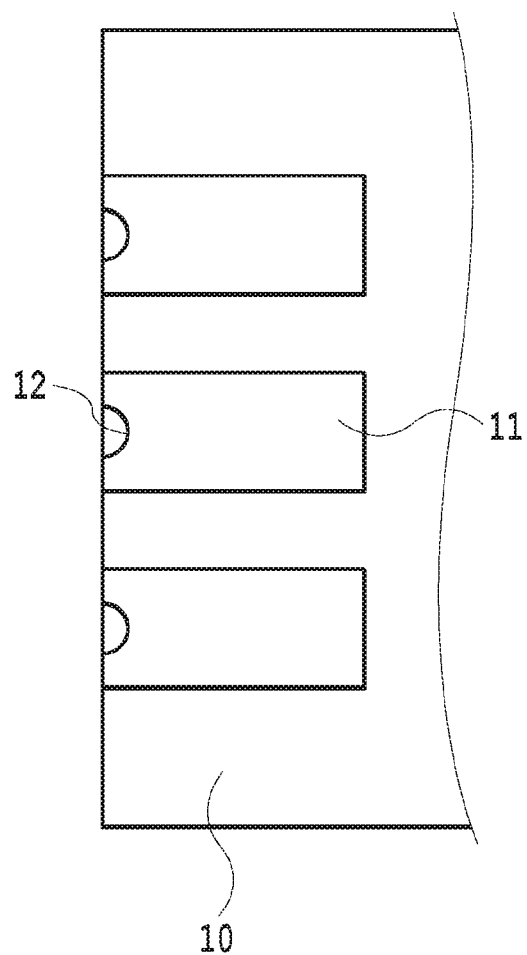
FIG. 4A is a top view illustrating a specific configuration on a package side in the solder joint structure of the present invention.
Figure 4B:
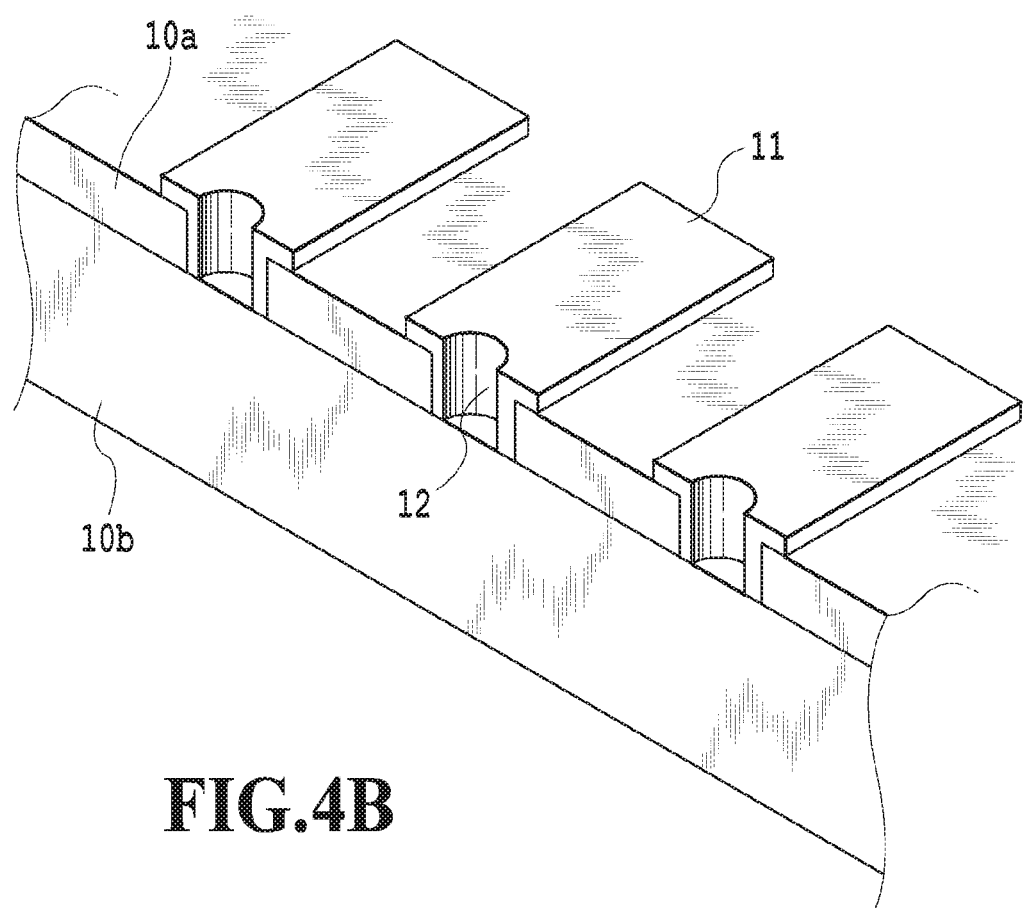
FIG. 4B is a perspective view illustrating the specific configuration on the package side in the solder joint structure of the present invention.

FIG. 4A and FIG. 4B are views illustrating a specific configuration on a package side in the solder joint structure according to the present invention. FIG. 4A shows a top view in the vicinity of the end face of a package board and FIG. 4B is a perspective view viewing the side face of the end part of the board. The package 10 is electrically connected to another external circuit on the FPC shown in FIG. 3A and FIG. 3B. For instance, the present invention may have a terrace-like protruded portion in a ceramic-made package of the optical transceiver module connected to the FPC by soldering. Alternatively, the present invention may be a PCB in which a circuit having a predetermined processing function for electric signals is mounted.

On the board face at the end part of the package 10, there is provided a plurality of electrode pads 11 having generally the same size in a shape corresponding to the conductive electrodes 3a, 3b of the FPC. In the solder joint structure of the present invention, a side face interconnection electrode 12 (second side face electrode) is formed continuously from each of the plurality of electrode pads 11 on the side face of the board end part on the package side. The side face interconnection electrode 12 can be formed, at a stage of producing a ceramic package, by forming a through hole connecting a surface layer and an inner layer and then cutting it in a vertical direction with respect to the board surface. The ceramic package is formed by burning multi-layered green sheets and by drilling a surface layer sheet or printing a conductive pattern thereon to form a through hole electrode between a surface layer 10a and an inner layer 10b. The end face shown in FIG. 4B can be obtained by cutting this through hole. In FIG. 4B, the side face interconnection electrode 12 ends in the middle of the board side face, but may be extended to the opposite side of the face in which the plurality of electrode pads 11 are formed. As will be described later, melted solder flows in the side face interconnection electrode 12, and the state of solder joint between the FPC 1 and the package 10 becomes visible depending on the state of the soldered portion of the side face interconnection electrode 12.

The thickness of the package board is approximately 500 to 1000 μm, and the plurality of electrode pads 11 are generally the same size as the electrode pads of the FPC. The thickness of the electrode pad is 5 to 20 electrode pads. The numerical values of these dimensions are merely an example, and these dimensions may vary, as a matter of course, depending on a board material or manufacturing conditions.

Therefore, the solder joint structure of the present invention connects a first board 1 composed of a first material having flexibility and a second board 10 composed of a second material that is different from the first material, wherein the first board includes a plurality of electrode pads formed along an end part of the first board, each of the plurality of electrode pads includes two corresponding conductive electrodes 3a, 3b having generally the same shape on both faces sandwiching the first board, the two corresponding conductive electrodes are mutually connected by at least one through hole 4a, 4b, the two corresponding conductive electrodes, including an inner part of the through hole, have a solder layer formed thereon; the second board includes a plurality of electrode pads formed along an end part of the second board to face the conductive electrodes on one face of the first board, and a side face electrode 12 formed continuously from the plurality of facing electrode pads onto a side face of the end part of the second board; and the conductive electrodes 3b on the one face of the first board and the plurality of facing electrode pads 11 on the second board are solder joined with the solder layer, and a joined state of a soldered portion 5a on the side face electrode 12 formed continuously from the solder joint is configured to be visible from the first board side of the solder joint.

Further, the solder joint structure of the present invention may also be achieved such that the solder joint structure connects a first board 1 composed of a first material having flexibility and a second board 10 composed of a second material that is different from the first material, wherein the first board includes a plurality of electrode pads formed along an end part of the first board, each of the plurality of electrode pads includes two corresponding conductive electrodes 3a, 3b having generally the same shape on both faces sandwiching the first board, the two corresponding conductive electrodes are mutually connected by at least one through hole 4a, 4b, the two corresponding conductive electrodes, including an inner part of the through hole, have a solder layer formed thereon, and the two corresponding conductive electrodes are further mutually connected by a side face electrode 6 formed on a side face of the end part of the first board; the second board includes a plurality of electrode pads 11 formed along an end part of the second board to face the conductive electrodes on one face of the first board; and the conductive electrodes 3b on the one face of the first board and the plurality of facing electrode pads 11 on the second board are solder joined with the solder layer, and a joined state of a soldered portion 5b on the side face electrode 6 formed continuously from the solder joint is configured to be visible from the second board side of the solder joint. At this time, the second board may preferably include a side face electrode 12 formed continuously from the plurality of facing electrode pads onto the second board on a side face of the end part of the second board, and a joined state of a soldered portion 5a on the side face electrode formed continuously from the solder joint may be configured to be visible from the first board side of the solder joint.

Figure 5A:
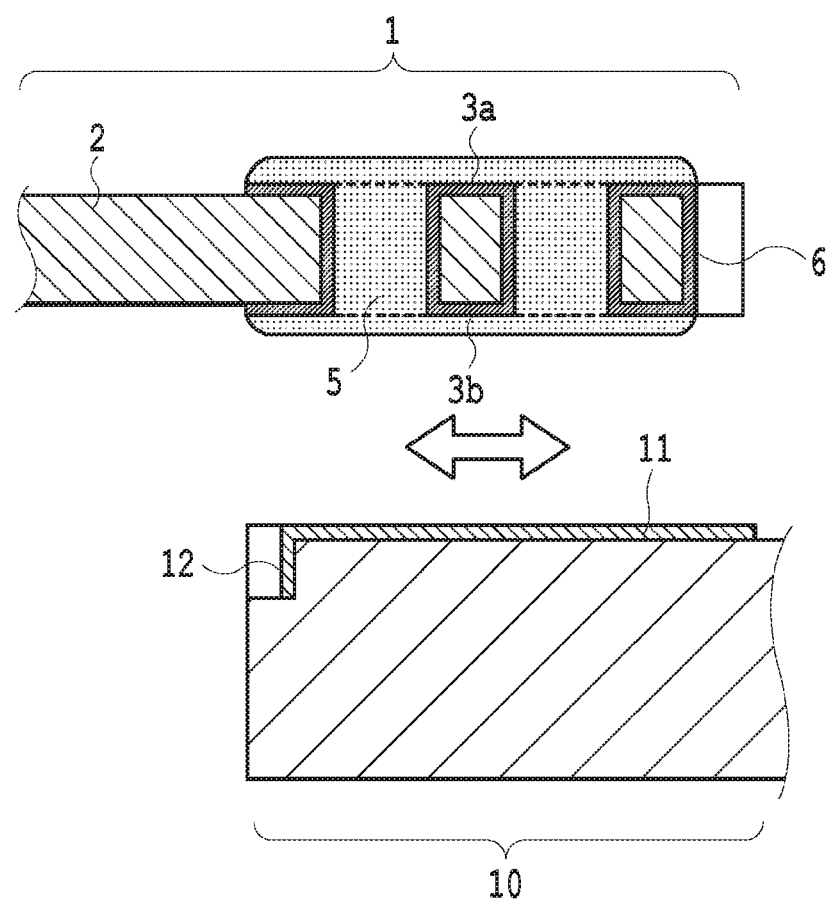
FIG. 5A is a first view illustrating a process of joining the FPC to the package by soldering of the present invention.
Figure 5B:
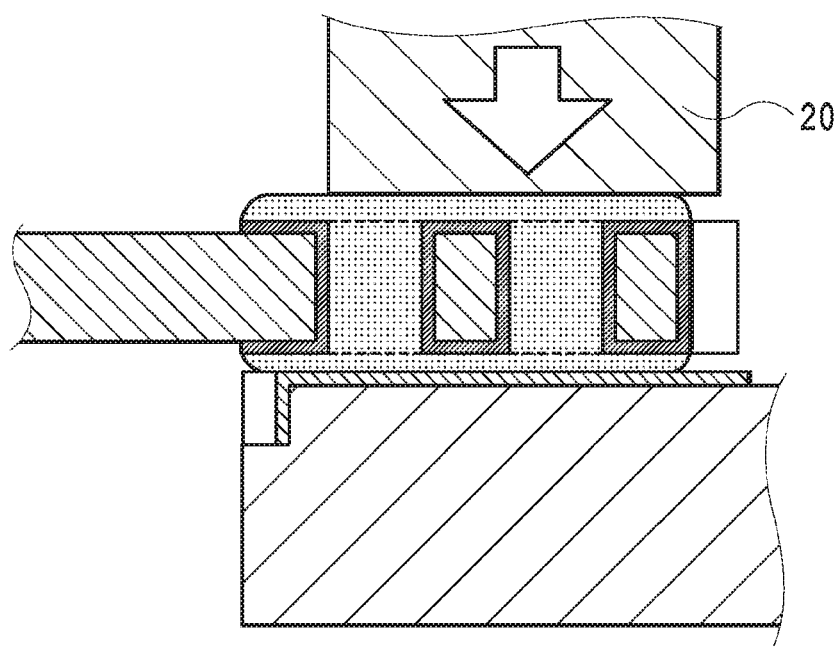
FIG. 5B is a second view illustrating the process of joining the FPC to the package by the soldering of the present invention.
Figure 5C:
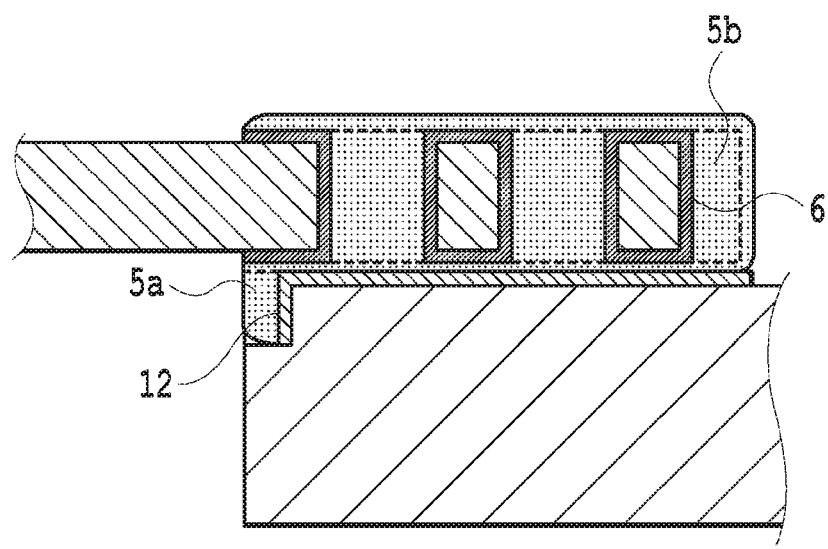
FIG. 5C is a third view illustrating the process of joining the FPC to the package by the soldering of the present invention.

FIG. 5A to FIG. 5C are views illustrating a process of joining the FPC and the package by soldering according to the present invention. As shown in FIG. 5A, alignment of the preliminarily soldered FPC 1 and the package 10 is made (aligning process). The conductive electrode 3b at the lower face of the electrode pad of the FPC 1 and the electrode pad 11 on the package 10 are aligned within the board face so as to bring into a state in which they oppose to each other in a solder joint face, the solder layer formed on the surface of the conductive electrode 3b at the lower face of the FPC 1 is contacted to the electrode pad 11 of the package. Next, as shown in FIG. 5B, a thermocompression tool 20 is brought into contact with solder on the surface of the conductive electrode 3a at a side opposite to the solder joint face of the FPC 1 to make heating and pressurization (heating and pressurizing process). By heating the upper face of the conductive electrode 3a, solder on the upper face of the conductive electrode 3a is melted, and further, solder on the surface of the conductive electrode 3b on the solder joint face side is also melted due to solder filling the through hole. By making pressurization with the thermocompression tool 20, soldering is made on the electrode pad 11 on the package. FIG. 5B shows that not entire solder is yet melted, and shows a state in which solder does not reach the extent of the side face connecting wiring 6 (first side face electrode) of FPC 1 and the side face interconnection electrode 12 (second side face electrode) of the package 10.

FIG. 5C shows a state in which soldering is entirely completed. By retaining the state of heating and pressurization shown in FIG. 5B, solder joint between the FPC 1 and the package 10 becomes in the state shown in FIG. 5C. At this time, the solder 5b flows in the side face connecting wiring 6 (first side face electrode) at the end part of the FPC 1, and reaches inside a half through hole to connect the conductive electrodes 3a, 3b corresponding to the both faces of the board 2 of the FPC 1. Further, solder 5a also extends over the side face interconnection electrode 12 (second side face electrode) formed at the end part of the package 10 board. After the state of FIG. 5C has been reached, the temperature of the thermocompression tool 20 is lowered and the thermocompression tool 20 is removed from the upper face of the FPC 1 to complete the soldering process (cooling process). In a state in which the soldering process by heating and pressurization has been completed, a solder layer between the conductive electrode 3b on the lower face of the FPC and the electrode pad 11 on the package has a thickness of 10 to 25 μm, and sufficient joint strength can be achieved by this thickness. The solder thickness of this joint portion can be controlled by the condition setting of the thermocompression tool.

Figure 6A:
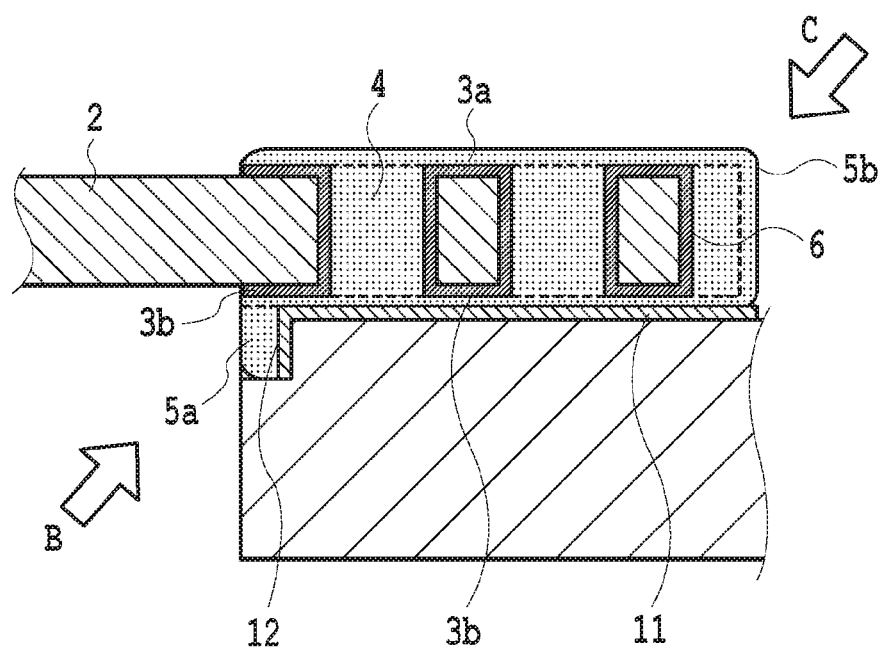
FIG. 6A is a cross-section view of the FPC and the package for the joint portion of the solder joint structure of the present invention.
Figure 6B:
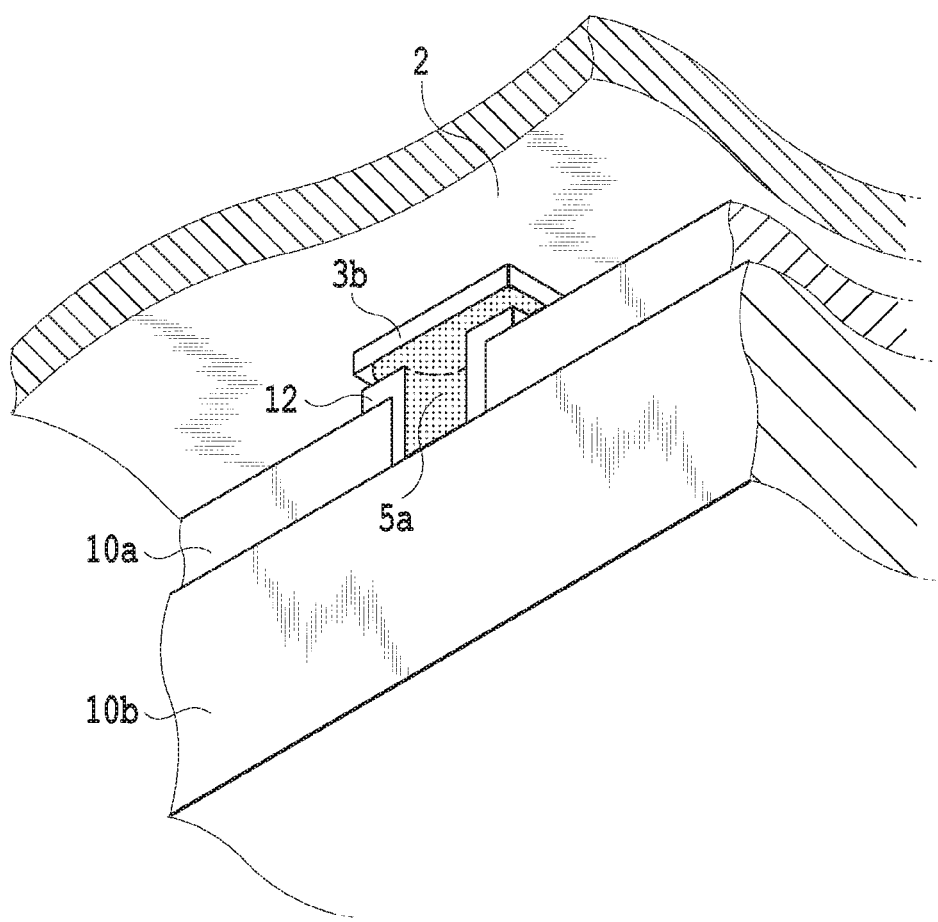
FIG. 6B is a view viewing one end side face of the FPC and the package for the joint portion of the solder joint structure of the present invention.
Figure 6C:
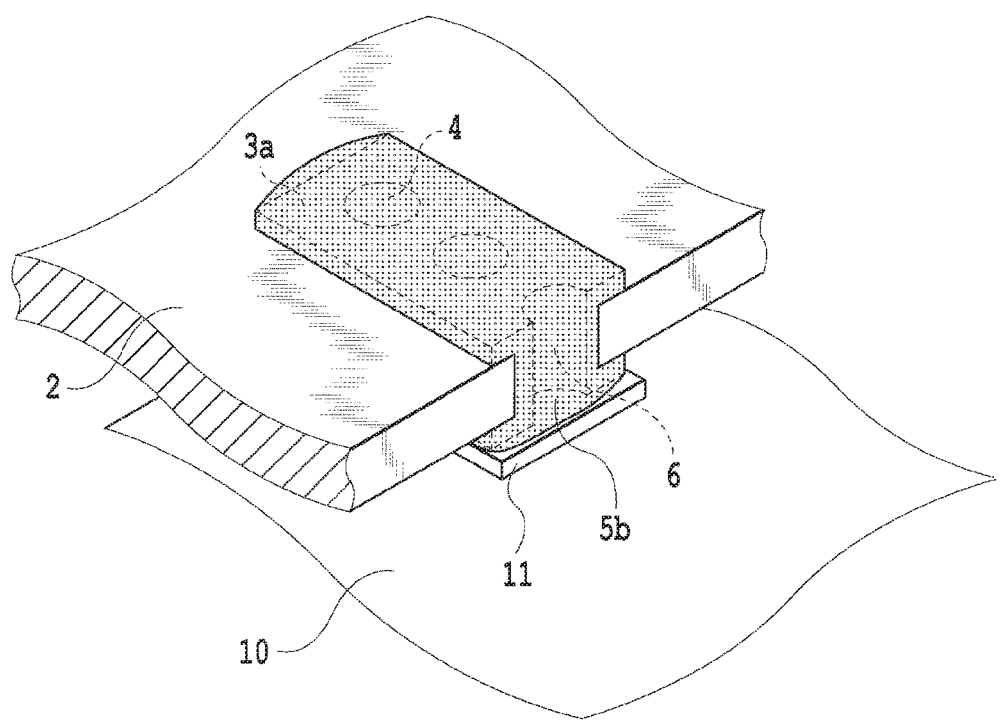
FIG. 6C is a view viewing another end side face of the FPC and the package for the joint portion of the solder joint structure of the present invention.

FIG. 6A to FIG. 6C are views viewing a cross section of the FPC and the package for the joint portion and each of the side faces of end parts in the solder joint structure according to the present invention. FIG. 6B is a view viewing an end side face of the package in an arrow B direction from the FPC 1 side shown in the cross-section view of FIG. 6A. Further, FIG. 6C is a view viewing an end side face of the FPC 1 in an arrow C direction from the package 10 side shown in the cross-section view of FIG. 6A. The state of soldered portions 5a, 5b flowed and affixed to the side face interconnection electrode 12 and the side face connecting wiring 6 each can be easily observed by visual inspection. In solder joint portions on two boards, the state of soldered portions 5a, 5b (side face electrodes) on each of the side faces of the board end parts is observed to confirm that favorable soldering is made between the conductive electrode 3a, 3b on both faces of the plurality of electrode pads of the FPC 1 and the plurality of electrode pads 11 on the package.

A conduction inspection was actually conducted to confirm that a favorable conduction state is achieved in a state in which sufficient solder is flowed and affixed to each of the side face electrodes. According to the soldered portions 5a, 5b on the side face electrodes of the board end parts in the solder joint structure of the present invention, detection of a defective solder joint can be very easily made. If the shape of a soldered portion on the side face electrode of the board end part is defective, there is a high possibility that the soldered state between facing electrode pads on the FPC and the package in the solder joint face as well as electrical properties is also defective. Therefore, by firstly inspecting the soldered portion on the side face electrodes of the board end parts in the solder joint structure of the present invention, it is possible to spot the presence of a defective joint in an early stage of a manufacturing process, and thus components and products which include defective solder joints can be screened out at an initial stage of the inspecting process. As a result, an inspection which will be required only for a device, such as an optical transceiver module, that does not include any defective solder joint can be further conducted. There is no need to conduct a wasteful conduction inspection or the like relating to specific electrical properties on defective components and defective devices, and thus an efficient inspecting process for components and products can be achieved.

Further, in the solder joint structure of the present invention, due to the soldered portions 5a, 5b on each of the side face electrodes of the FPC and the package being visible, the above-described inspection of the soldered portions allows spotting the presence of a defective joint in the early stage of the manufacturing process, and thus components and products which include defective solder joints can be screened out at the initial stage of the inspecting process. Therefore, in the solder joint structure of the present invention, the soldered portion is favorably visible at least immediately after the solder joint is formed and when the above inspection on the soldered portion is made. Even when the soldered portions 5a, 5b on the side face electrodes are in a state of being masked or shut out, for example, and is not visible after the soldering is accomplished and the inspection is conducted or in a state where a product including a solder joint is produced, it should be noted that the solder joint structure of the present invention exerts its advantageous result as long as the structure includes a soldered portion on each of the side face electrodes of the board end parts.

In the solder joint structure shown in FIG. 1A to FIG. 6C, explanations on the plurality of electrode pads which are arranged in one row on each of the end parts of the boards have been given as an example. In the optical transceiver module which requires to have further multi-channels, a number of electric terminals are to be required. In this case, the plurality of electrode pads can be arranged in two rows or more. The solder joint structure of the present invention can be, as in the following embodiment, applied to the case of a configuration in which the plurality of electrode pads are arranged in two rows or more.

Second Embodiment

Figure 7A:
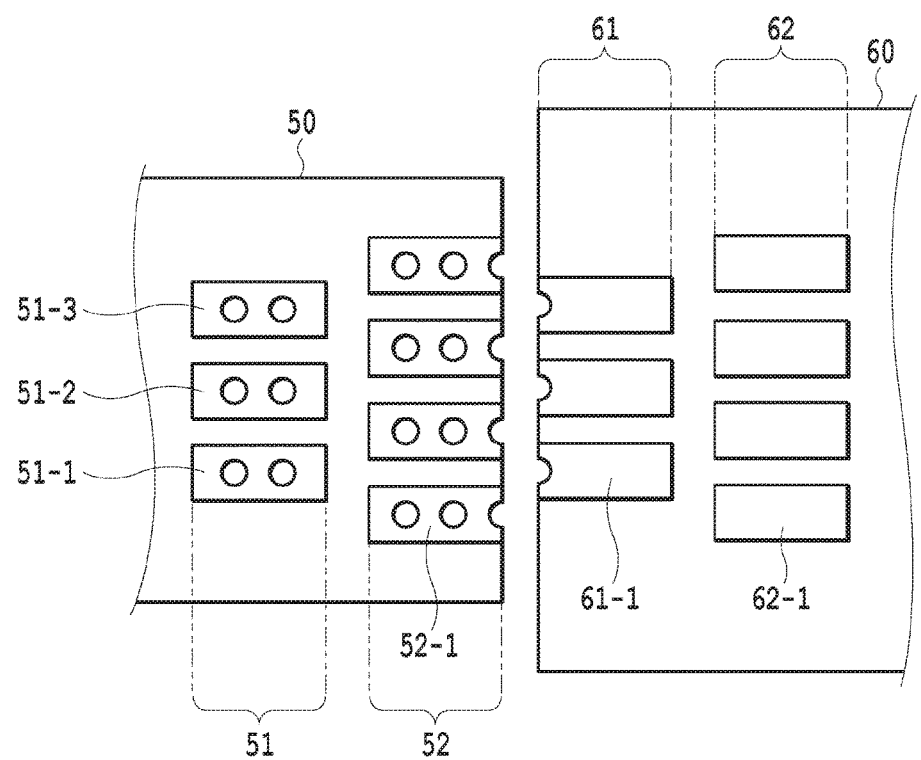
FIG. 7A is a view showing a configuration before soldering according to a second embodiment of the solder joint structure of the present invention.
Figure 7B:
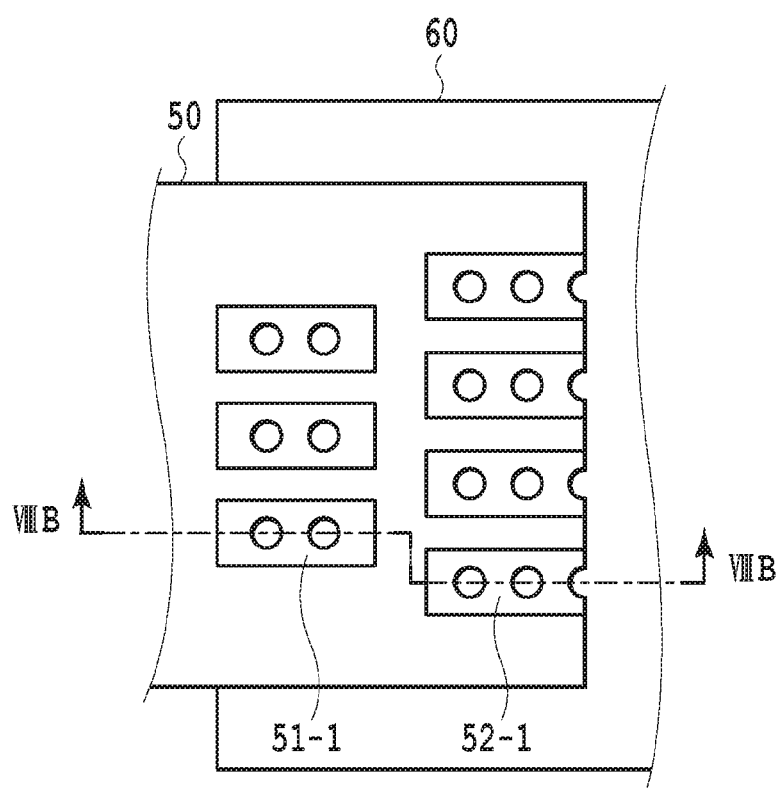
FIG. 7B is a view showing a configuration after soldering according to the second embodiment of the solder joint structure of the present invention.

FIG. 7A and FIG. 7B are views showing a configuration of a second embodiment of the solder joint structure of the present invention. FIG. 7A is a top view viewing the respective end parts of an FPC 50 and a package 60 before soldering, and FIG. 7B is a top view of the two boards after the soldering. On the board end part of the FPC 50, a plurality of first-row electrode pads 52 aligned along the end of the board are formed, and further, a plurality of second-row electrode pads 51 are formed adjacent to the plurality of first-row electrode pads 52. As in the first embodiment, each electrode pad for the two rows of the plurality of electrode pads 51, 52 is configured such that two corresponding conductive electrodes having generally the same shape on the faces of the opposite sides sandwiching the board are mutually connected via a through hole. On the end part of the package 60 board, two rows of the plurality of electrode pads 61, 62 are formed on positions corresponding to the two rows of the plurality of electrode pads 51, 52. For example, first-row electrode pads 52-1 on the FPC 50 correspond to second-row electrode pads 62-1 from the board end of the package 60 for soldering.

The size of the electrode pad is identical to that in the first embodiment, and therefore, an explanation will not be repeated. An interval between the first-row electrode pad and the second-row electrode pad may be, for example, set to 250 μm. The number of electrodes may be, for example, set to 10 to 20 per row, which is approximately 8 mm for 10 terminals and approximately 16 mm for 20 terminals.

In FIG. 7A and FIG. 7B, a case where the plurality of first-row electrode pads 52 are four in number and the plurality of second-row electrode pads 51 are three in number on the FPC 50 is shown, but the number of the electrode pads is not limited to this. While considering the withstand voltage property of a non-illustrated wiring, in FIG. 7A and FIG. 7B, the two rows of the electrode pads are arranged in a staggered manner in order to increase the arrangement density of the electrode pads, but may be simply arranged in a lattice shape. On each of the side faces of the conductive electrodes on the plurality of first-row electrode pads 52 on the board end of the FPC 50, as explained in FIG. 2A and FIG. 2B, a side face connecting electrode (first side face electrode) that electrically connects the electrode pad 52 located on the upper face (surface) of the board and the corresponding conductive electrode located on the lower face (back face), which is not shown in FIG. 7A and FIG. 7B, is formed. Further, on each of the side faces of a plurality of first-row electrode pads 61 located on the board end of the package 60, as explained in FIG. 4B, a side face interconnection electrode (second side face electrode) formed continuously from each of the plurality of electrode pads 61 is formed. Before soldering, solder paste in the same size as a pad size is formed, by printing, on the conductive electrodes of the plurality of electrode pads 51, 52 on the FPC 50. After printing solder paste, a reflow is made amid an atmosphere, nitrogen (N2), a vacuum, a formic acid (HOOCH) atmosphere, or the like, and then the through holes are filled with solder.

Figure 8A:
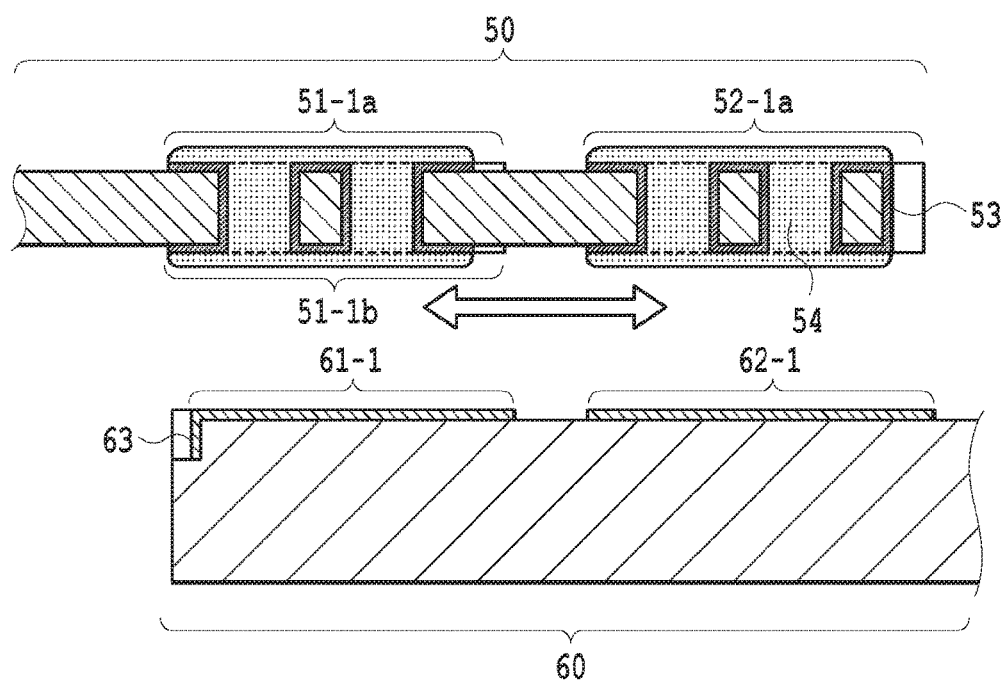
FIG. 8A is a first view illustrating a joining process of the solder joint structure according to the second embodiment of the present invention.
Figure 8B:
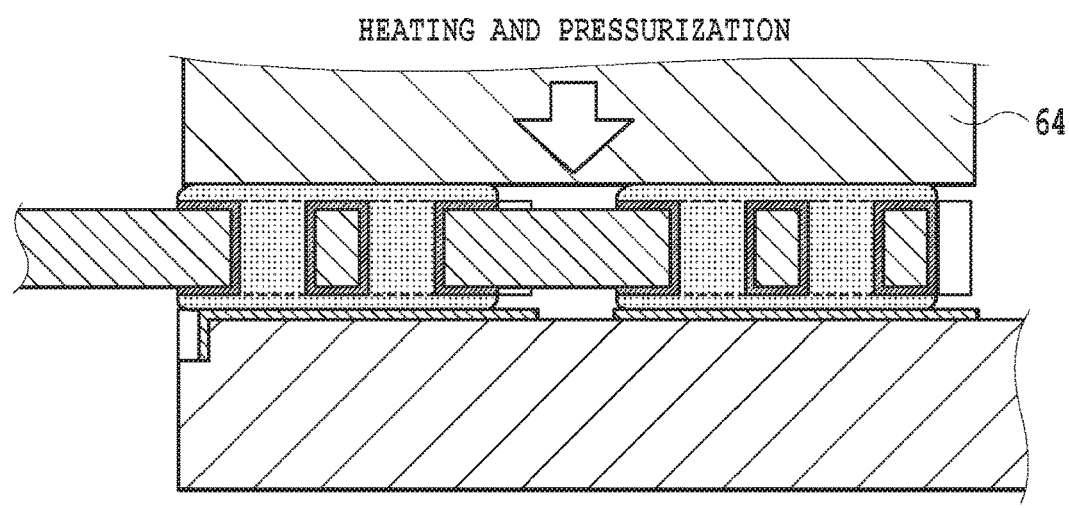
FIG. 8B is a second view illustrating the joining process of the solder joint structure according to the second embodiment of the present invention.
Figure 9A:
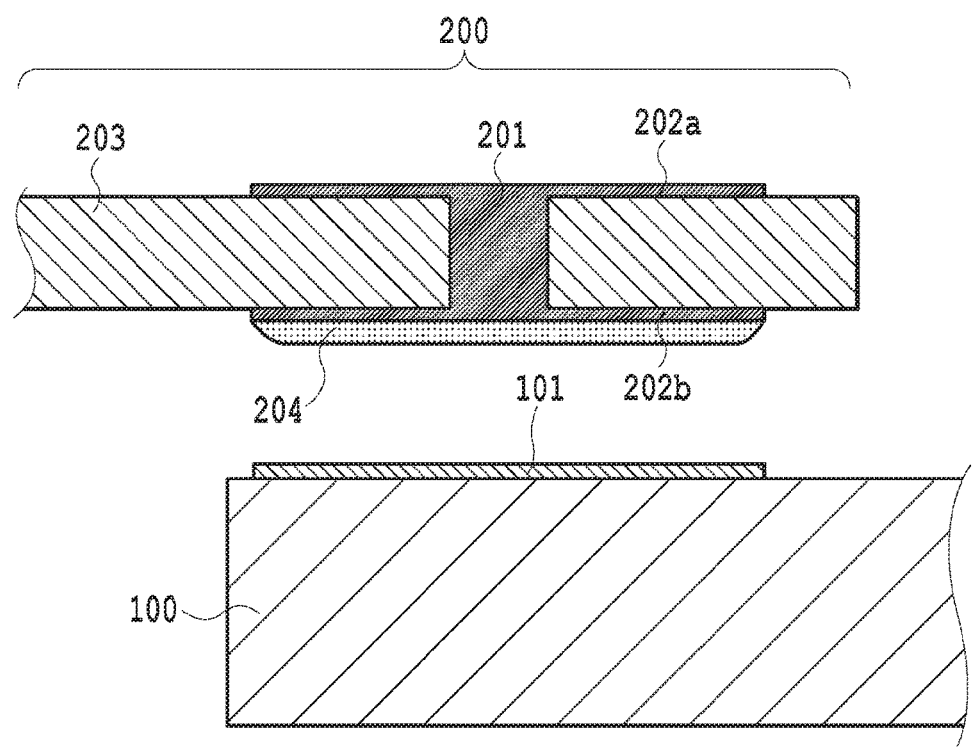
FIG. 9A is a first view illustrating a soldering method of the FPC using a conventional technique.
Figure 9B:
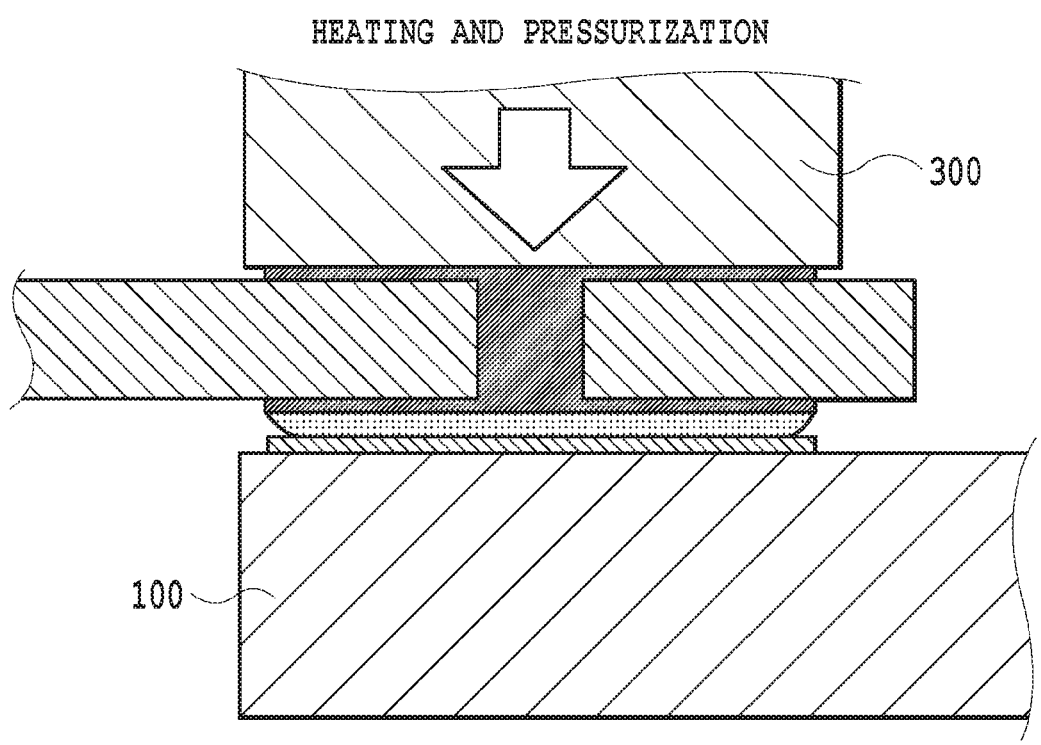
FIG. 9B is a second view illustrating the soldering method of the FPC using the conventional technique.

FIG. 8A to FIG. 8C are views illustrating a soldering process of the solder joint structure according to the second embodiment of the present invention. As shown in FIG. 8A, the electrode pads on the FPC 50 and on the package 60 are firstly aligned to bring a solder layer formed on the surface of the conductive electrodes on the lower face of the FPC 50 into contact with the electrode pads on the package 60. Next, as shown in FIG. 8B, a thermocompression tool 64 is brought into contact with solder formed on the surface of electrode pads 51-1a, 52-1a on the upper face of the FPC 50 to make heating and pressurization. By heating the conductive electrodes on the upper face of the FPC 50, solder on the conductive electrodes melts, and solder on the surface of the conductive electrodes on the lower face also melts through a solder 54 that fills the through hole. By pressurizing a joint portion, soldering is made between the conductive electrodes on the lower surface of the FPC 50 and electrode pads 61-1, 62-1 on the package 60.

In FIG. 8C, a view viewing a side face connecting electrode 53 of the FPC from the package 60 side is shown at the right side of a cross-section view and a view viewing a side face connecting electrode 63 of the package from the FPC 50 side is shown at the left side of the cross-section view. At this time, as shown in FIG. 8C, solder flows into the side face connecting electrode 53 (first side face electrode) electrically connecting the lower and upper conductive electrodes on the end part of the FPC 50 board and a side face interconnection electrode 63 (second side face electrode) on the end part of the package 60 board, and then soldering of the electrode pads between the FPC 50 and the package 60 is made. The state of soldering the plurality of electrode pads arranged in two rows can be confirmed by visually observing each of the state of a soldered portion 54a flowed and affixed onto a side face interconnection electrode 53 of the board end of the FPC 50 and the state of a soldered portion 54b flowed and affixed onto a side face interconnection electrode 63 of the end part of the package 60 board by visual inspection.

As in the first embodiment, a conduction inspection was actually conducted to confirm that a favorable conduction state is achieved in a state in which sufficient solder is flowed and affixed to these portions. Also, as in the first embodiment, by firstly inspecting the soldered portion on the side face of the board end part in the solder joint structure of the present invention, components and products which include defective solder joints can be screened out at an initial stage of the inspecting process. As a result, a time-consuming inspecting process can be conducted only on a device, such as an optical transceiver module, that does not include a defective solder joint. There is no need to conduct a wasteful conduction inspection or the like relating to specific electrical properties on defective components and defective devices, and thus the efficient inspecting process for products can be achieved.

In the present embodiment, the plurality of electrode pads in two rows have been exemplified, but even in a case where three or more rows of the plurality of electrode pads are formed, an advantageous result of the present invention can still be obtained similar to the first and second embodiments. The failure of a solder joint often generally occurs in the vicinity of an area where soldering is made. Therefore, in a case where the three rows of electrode pads are formed on each of the electrical wiring connection units on the FPC and the package, the failure of a solder joint may possibly occur on the plurality of first-row electrode pads along the board end of the FPC, or the plurality of first-row electrode pads along the board end of the package, that is, the plurality of third-row electrode pads of the FPC. In a case of arranging the three rows of electrode pads, the side face interconnection electrode 53 of the FPC and the side face interconnection electrode 63 on the board end of the package cannot be formed on a plurality of second-row electrode pads located in the middle. However, a similar advantageous result to those in the first and second embodiments can be obtained in the aspect of discovering a defective solder joint due to each of the side face electrodes and screening components and products which include a defective solder joint at an initial stage of the inspecting process to achieve efficient the inspecting process with respect to the electrode pads located at the end part of each board which are likely to cause failure.

As described above, according to the present invention, the state of a solder joint can be easily confirmed by visual inspection, and thus inspections can be efficiently conducted in a short time. Particularly, an advantageous result is specifically exerted in the case of soldering the package of the multi-channel optical transceiver module, which requires multiple electric signal wirings, to the FPC. However, the solder joint structure of the present invention can be, of course, widely applied to the case of soldering multiple electrodes to one another between the FPC on one side and another board on the other side. Therefore, the purpose of its use is not limited to the optical transceiver module, but the use of soldering the multiple electrode pads to one another can be applied to modules, PCBs, devices, and the like which have various functions of electrically connecting the outside via the FPC.

INDUSTRIAL APPLICABILITY

The present invention may be generally used for electrical connection units of electrical components. In particular, the present invention may be used for implementing an optical transceiver module and the like in an optical communication system.

The invention claimed is:

1. A solder joint structure connecting a first board composed of a first material having flexibility and a second board composed of a second material that is different from the first material, wherein:
    the first board includes a plurality of electrode pads formed along an end part of the first board, each of the plurality of electrode pads includes two corresponding conductive electrodes having generally the same shape on both faces sandwiching the first board, the two corresponding conductive electrodes are mutually connected by at least one through hole, the two corresponding conductive electrodes, including an inner part of the through hole, have a solder layer formed thereon, and the two corresponding conductive electrodes are further mutually connected by a side face electrode formed on a side face of the end part of the first board;
    the second board includes a plurality of electrode pads formed along an end part of the second board to face the conductive electrodes on one face of the first board; and
    the conductive electrodes on the one face of the first board and the plurality of facing electrode pads on the second board are solder joined with the solder layer, and the solder joint is configured such that a joined state of a soldered portion on the side face electrode formed continuously from the solder joint is visible from the second board side of the solder joint.

2. The solder joint structure according to claim 1, wherein the second board includes a side face electrode formed continuously from the plurality of facing electrode pads on the second board onto a side face of the end part of the second board, and the solder joint is configured such that a joined state of a soldered portion on the side face electrode formed continuously from the solder joint is visible from the first board side of the solder joint.

3. The solder joint structure according to claim 1, wherein the side face electrode of the first board is formed by cutting a through hole, which pierces the first board, in a vertical direction with respect to a face of the first board.

4. The solder joint structure according to claim 2, wherein the side face electrode of the first board is formed by cutting a through hole, which pierces the first board, in a vertical direction with respect to a face of the first board.

5. The solder joint structure according to claim 1, wherein the plurality of electrode pads of the first board and the plurality of facing electrode pads of the second board are each formed in two or more rows along the board end part, and each of the side face electrodes is formed on an electrode pad on a closest row to the end part of the respective boards.

\* \* \* \* \*